(12) United States Patent
Abe

(10) Patent No.: US 10,038,118 B2
(45) Date of Patent: Jul. 31, 2018

(54) LIGHT EMITTING ELEMENT

(71) Applicant: NICHIA CORPORATION, Anan-shi, Tokushima (JP)

(72) Inventor: Makoto Abe, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/713,454

(22) Filed: Sep. 22, 2017

(65) Prior Publication Data

US 2018/0090643 A1    Mar. 29, 2018

(30) Foreign Application Priority Data

Sep. 23, 2016  (JP) ................................. 2016-186138

(51) Int. Cl.
| | | |
|---|---|---|
| *H01L 33/00* | (2010.01) | |
| *H01L 33/32* | (2010.01) | |
| *H01S 5/30* | (2006.01) | |
| *H01L 33/20* | (2010.01) | |

(52) U.S. Cl.
CPC .......... *H01L 33/32* (2013.01); *H01L 33/0025* (2013.01); *H01L 33/20* (2013.01); *H01S 5/3013* (2013.01)

(58) Field of Classification Search
None
See application file for complete search history.

(56) References Cited

U.S. PATENT DOCUMENTS

| | | | | |
|---|---|---|---|---|
| 2014/0166980 | A1* | 6/2014 | Goda ..................... | H01L 33/06 257/13 |
| 2014/0326948 | A1* | 11/2014 | Tangring ................. | H01L 33/06 257/13 |
| 2016/0181471 | A1* | 6/2016 | Tangring ................. | H01L 33/32 257/13 |
| 2017/0309775 | A1* | 10/2017 | Kim ....................... | H01L 33/007 |
| 2017/0309777 | A1* | 10/2017 | Tangring ................. | H01L 33/32 |
| 2017/0338378 | A1* | 11/2017 | Fujita .................... | H01L 33/145 |

FOREIGN PATENT DOCUMENTS

| | | |
|---|---|---|
| JP | 2000-196201 A | 7/2000 |
| JP | 2001-168471 A | 6/2001 |
| JP | 2005-051170 A | 2/2005 |
| JP | 2007-116153 A | 5/2007 |

* cited by examiner

*Primary Examiner* — Alexander Ghyka
(74) *Attorney, Agent, or Firm* — Foley & Lardner LLP

(57) ABSTRACT

A light emitting element includes: an n-side semiconductor layer; a p-side semiconductor layer; an active layer comprising a plurality of well layers and a plurality of barrier layers, and being located between the n-side semiconductor layer and the p-side semiconductor layer. The plurality of barrier layers comprises a final barrier layer, which is a layer of the active layer that is closest to the p-side semiconductor layer. The p-side semiconductor layer comprises, from an active layer-side, a first p-side semiconductor layer, which is a layer of the p-side semiconductor layer that is closest to the active layer, and a second p-side semiconductor layer containing a p-type dopant and having a bandgap greater than a bandgap of the final barrier layer. The first p-side semiconductor layer has a bandgap smaller than the bandgap of the final barrier layer and greater than a bandgap of any of the well layers, and has a thickness smaller than a thickness of the final barrier layer.

20 Claims, 1 Drawing Sheet

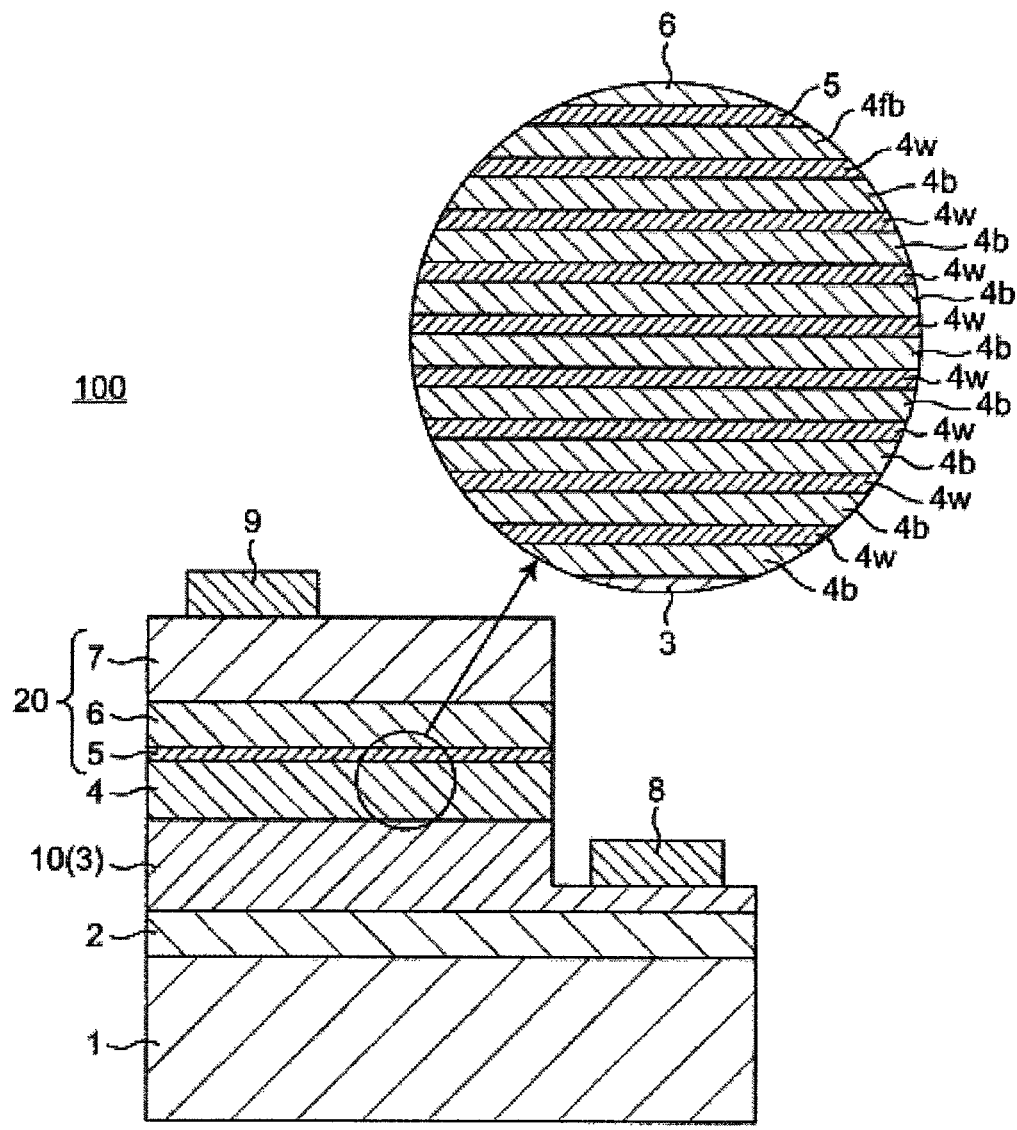

LIGHT EMITTING ELEMENT

CROSS-REFERENCE TO RELATED PATENT APPLICATION

The present application claims priority under 35 U.S.C. § 119 to Japanese Patent Application No. 2016-186138, filed Sep. 23, 2016, the contents of which are hereby incorporated by reference in their entirety.

BACKGROUND

The present disclosure relates to a light emitting element.

In recent years, semiconductor light emitting elements such as light emitting diodes have been used in various applications such as in various lightings. Thus, the light emitting elements are expected to emit light of high luminance with a low driving voltage. In order to meet such a demand, for example, Japanese Unexamined Patent Application Publication No. 2007-116153 describes a structure of electrodes for dispersing electric current to reduce the driving voltage and improve the luminance.

SUMMARY

In recent years, a light emitting element that can be driven with a much lower driving voltage has been in demand, but conventional light emitting device cannot sufficiently satisfy such a requirement.

Accordingly, one aim of certain embodiments of the present invention is to provide a light emitting element that can emit light with a much lower driving voltage.

In one embodiment, a light emitting element includes an n-side semiconductor layer; a p-side semiconductor layer, an active layer including a plurality of well layers and a plurality of barrier layers, and being provided between the n-side semiconductor layer and the p-side semiconductor layer, the plurality of barrier layers including a final barrier layer being closest of the active layer to the p-side semiconductor layer, the p-side semiconductor layer including, from the active layer-side, a first p-side semiconductor layer being closest of the p-side semiconductor layer to the active layer, and a second p-side semiconductor layer containing a p-type dopant and having a bandgap greater than a bandgap of the final barrier layer; and the first p-side semiconductor layer having a bandgap smaller than the bandgap of the final barrier layer and greater than a bandgap of any one of the well layers, and having a thickness smaller than a thickness of the final barrier layer.

The light emitting element according to certain embodiments of the present invention can emit light with a lower driving voltage.

BRIEF DESCRIPTION OF THE DRAWINGS

FIG. 1 is a cross-sectional view schematically showing a configuration of a light emitting device according to one embodiment of the present invention.

DETAILED DESCRIPTION

A semiconductor light emitting element according to embodiments of the present invention will be described below with reference to the drawing.

The light emitting element 100 according to the embodiment shown in FIG. 1 includes a substrate 1, an underlayer 2, an n-side semiconductor layer 10, an active layer 4, and a p-side semiconductor layer 20, on the substrate 1. The n-side semiconductor layer 10 is on the substrate 1 via the underlayer 2, and including at least an n-type contact layer 3. The active layer 4 is provided on the n-side semiconductor layer 10 and includes a plurality of barrier layers 4b and a plurality of well layers 4w that are alternatively disposed, and a final barrier layer 4fb provided closest of the active layer 4 to the p-side semiconductor layer 20. The p-side semiconductor layer 20 is provided on the active layer 4 and includes, in order from the active layer 4 side, a first p-side semiconductor layer 5, a second p-side semiconductor layer 6, and a p-type contact layer 7. In the p-side semiconductor layer 20, the second p-side semiconductor layer 6 contains a p-type dopant and has a bandgap greater than that of the final barrier layer 4fb. Further, in the p-side semiconductor layer 20, the first p-side semiconductor layer 5 is provided between the final barrier layer 4fb and the second p-side semiconductor layer 6 so that the first p-side semiconductor layer 5 is the closest layer in the p-side semiconductor layer 20 to the active layer 4 and is in contact with the final barrier layer 4fb. The first p-side semiconductor layer 5 has a bandgap smaller than that of the final barrier layer 4fb and greater than that of the well layers 4w, and has a thickness smaller than that of the final barrier layer 4fb.

A p-electrode 9 is disposed on a part of the surface of the p-type contact layer 7, and an n-electrode 8 is disposed on an exposed surface of the n-type contact layer 3 (electrode forming surface) obtained by removing a partial region of the p-type contact layer 7, the second p-side semiconductor layer 6, the first p-side semiconductor layer 5, and the active layer 4.

The light emitting element according to the present embodiment having a configuration as described above has the first p-side semiconductor layer 5 between the final barrier layer 4fb and the second p-side semiconductor layer 6, with a bandgap smaller than that of the final barrier layer 4fb and having a thickness smaller than that of the final barrier layer 4fb, so that an activation ratio of the p-type dopant contained in the second p-side semiconductor layer 6 can be increased and a carrier concentration in the second p-side semiconductor layer 6 can be increased. Thus, in the light emitting element 100 according to the present embodiment, the resistance of the second p-side semiconductor layer 6 can be reduced and the driving voltage can be reduced.

For example, when a p-type dopant such as Mg is doped into a nitride semiconductor, there is a general tendency of the higher the bandgap of the nitride semiconductor, the lower activation ratio of the p-type dopant.

On the other hand, the first p-side semiconductor layer 5 having a bandgap smaller than that of the final barrier layer 4fb provided between the final barrier layer 4fb and the second p-side semiconductor layer 6 allows a reduction in the bandgap of the second p-side semiconductor layer 6 at the first p-side semiconductor layer 5 side. Accordingly, the activation ratio of the second p-side semiconductor layer at the first p-side semiconductor layer 5 side can be increased and the carrier concentration in the second p-side semiconductor layer 6 can be increased. Accordingly, the driving voltage of the light emitting element according to the present embodiment can be reduced.

As for a light emitting element made of a nitride semiconductor, with the first p-side semiconductor layer 5 having a bandgap smaller than that of the final barrier layer 4fb provided between the final barrier layer 4fb and the second p-side semiconductor layer 6, internal electric field due to spontaneous polarization and piezoelectric polarization at the bonding interface can be reduced. This allows a reduction in the barrier to the holes injected in the active layer 4 from the second p-side semiconductor layer 6, and the driving voltage can be further reduced.

The first p-side semiconductor layer 5 according to the present embodiment will be described in more detail below.

The first p-side semiconductor layer 5 is, as described above, provided between the final barrier layer 4*fb* and the second p-side semiconductor layer 6, and has a bandgap smaller than that of the final barrier layer 4*fb*, and is configured to reduce the bandgap of the second p-side semiconductor layer 6 at the first p-side semiconductor layer 5 side to increase the activation ratio of the second p-side semiconductor layer 6 at the first p-side semiconductor layer 5 side, and further to lower the barrier to the holes injecting to the active layer 4. Accordingly, the first p-side semiconductor layer 5 preferably has a smaller thickness as long as it allows a reduction in the bandgap of the second p-side semiconductor layer at the first p-side semiconductor layer 5 side, and for example, the thickness of the first p-side semiconductor layer 5 is set in a range of 0.5 nm to 2.5 nm, preferably in a range of 1 nm to 2 nm, which is smaller than the thickness of any one of the well layers 4*w*. If the thickness of the first p-side semiconductor layer 5 is increased, the driving voltage of the light emitting element 100 may be increased and the optical output may be decreased.

The first p-side semiconductor layer 5 may contain, for example, a p-type dopant such as Mg, but undoped layer is preferable. In the present specification, "undoped layer" refers to a layer grown with a raw material gas that does not contain a dopant, but includes a layer containing unavoidable impurities. The concentration of the impurities contained in an undoped layer may be about $5 \times 10^{17}/cm^3$ or less.

Also, in a light emitting element made of a nitride semiconductor, the first p-side semiconductor layer 5 is preferably made of a nitride semiconductor containing In. For example, when each of the well layers 4*w* is made of a nitride semiconductor containing In, for example, arranging the In content in the first p-side semiconductor layer 5 smaller than the In content in any one of the well layers 4*w* allows for a greater bandgap in the first p-side semiconductor layer 5 than in each of the well layers 4*w*.

Further, the first p-side semiconductor layer 5 is preferably made of InGaN, obtained by substituting a portion of Ga in GaN with In.

Moreover, as long as the first p-side semiconductor layer 5 between the final barrier layer 4*fb* and the second p-side semiconductor layer 6 can reduce the bandgap of the second p-side semiconductor layer 6 at the first p-side semiconductor layer 5 side, a different layer may be provided between the first p-side semiconductor layer 5 and the second p-side semiconductor layer 6. However, in the light emitting element 100 according to the present embodiment, the first p-side semiconductor layer 5 is preferably in contact with the second p-side semiconductor layer 6 to more efficiently reduce the bandgap of the second p-side semiconductor layer 6 at the first p-side semiconductor layer 5 side.

Also, as long as the first p-side semiconductor layer 5 between the final barrier layer 4*fb* and the second p-side semiconductor layer 6 can reduce the bandgap of the second p-side semiconductor layer 6 at the first p-side semiconductor layer 5 side, a different layer may be provided between the first p-side semiconductor layer 5 and the final barrier layer 4*fb*. However, in the light emitting element 100 of the present embodiment, in order to control the internal electric field of the final barrier layer 4*fb* by the polarized charge generated at the interface between the final barrier layer 4*fb* and the first p-side semiconductor layer 5, so that the first p-side semiconductor layer 5 is preferably in contact with the final barrier layer 4*fb*.

When providing a light emitting element having a relatively short peak emission wavelength, for example, in a range of 250 nm to 500 nm, preferably in a range of 350 nm to 470 nm, a large improvement can be expected by providing the first p-side semiconductor layer 5 as in the light emitting element of the present embodiment.

When a conventional light emitting element that does not have the first p-side semiconductor layer 5 has a configuration in which the bandgap of the final barrier layer 4*fb* is smaller than the bandgap of the second p-side semiconductor layer 6 and the second p-side semiconductor layer 6 and the final barrier layer 4*fb* are in contact with each other, a bandgap of the final barrier layer at the second p-side semiconductor layer 6 side can be reduced. However, a light emitting element having a peak emission wavelength in a short wavelength range, the barrier layers 4*b* that include the final barrier layer 4*fb* are needed to have wide bandgaps, so that in some cases a sufficient difference in the bandgaps between the second p-side semiconductor layer 6 and the final barrier layer 4*fb* cannot be obtained. In such a case, even if the second p-side semiconductor layer 6 and the final barrier layer 4*fb* are provided in direct contact with each other, a reduction in the bandgap of the second p-side semiconductor layer 6 at the final barrier layer 4*fb* side is not sufficient to obtain an intended degree of reduction in the driving voltage.

On the other hand, in the light emitting element according to the present embodiment, the first p-side semiconductor layer 5 having a bandgap sufficiently different from that of the second p-side semiconductor layer 6 is provided between the second p-side semiconductor layer 6 and the final barrier layer 4*fb*, which makes it possible to increase the difference between the bandgap of the second p-side semiconductor layer 6 and the bandgap of the final barrier layer 4*fb*, and to increase the reduction of the bandgap of the second p-side semiconductor layer at the final barrier layer 4*fb* side. Thus, in the light emitting element according to certain embodiments described herein, the driving voltage can be efficiently reduced even when the difference between the bandgap of the second p-side semiconductor layer 6 and the bandgap of the final barrier layer 4*fb* is relatively small.

In the light emitting elements configured to emit light having peak emission wavelength in a short wavelength range such as ultraviolet light or near-ultraviolet light, barrier layers that includes a final barrier layer may be made of GaN or AlGaN that is made by substituting a portion of Ga of GaN with Al. Thus, when the final barrier layer is made of GaN or AlGaN that is made by substituting a portion of Ga of GaN with Al, a large improvement can be achieved by providing the first p-side semiconductor layer 5.

Each constituent component of the light emitting element according to the present embodiment will be described in detail below.

Substrate 1

For a substrate 1 used to form a semiconductor layer, for example, an insulating substrate such as a sapphire with a principal plane of C-plane, R-plane, or A-plane, or a spinel ($MgAl_2O_4$) can be used. Also for the substrate 1, SiC (6H-, 4H-, 3C-), ZnS, ZnO, GaAs, Si, or the like, may be used. Also, an oxide substrate that lattice matches a nitride semiconductor can be used. Of those, a sapphire substrate is preferable. The substrate 1 may be removed in a later step in the manufacturing. Above the substrate 1, in addition to the n-side semiconductor layer 10, the active layer 4, and the p-side semiconductor layer 20, a low-temperature growth buffer layer or the like may be disposed as an underlayer 2.

N-Side Semiconductor Layer 10, Active Layer 4, P-Side Semiconductor Layer 20

Examples of the nitride semiconductor include Group III-V nitride semiconductors ($In_XAl_YGa_{1-X-Y}N$, in which $0 \leq X$, $0 \leq Y$, and $X+Y \leq 1$). Further, B (boron) may be used for a portion or entire of Group III elements, or mixed crystal including a portion of N (nitrogen) that is a Group V element substituted with P, As, and/or Sb may be employed. The nitride semiconductor layers as described above are generally doped with an n-type or a p-type dopant. The semiconductor layer can be formed by using a known technique such as a metal organic vapor phase epitaxy method (MOCVD method), a hydride vapor phase epitaxy method (HVPE method), a molecular beam epitaxy method (MBE method).

The n-side semiconductor layer 10 suitably has a layer-structure that contains an n-type dopant in at least part thereof, and configured to supply and diffuse carriers into the electrode forming surface and the light emitting layer. In particular, in order to supply carriers from the n-electrode 8 toward the active layer 4 through in-plane diffusion, an n-type contact layer 3 doped with a relatively high concentration is preferably included in the n-side semiconductor layer 10. The n-type contact layer 3 is preferably made of GaN. Moreover, the n-type contact layer 3 preferably includes an electron diffusion layer that is configured to direct electric charge in the layering direction to supply electric charge to the active layer 4. Further, a nitride semiconductor layer and/or a multilayer film with relatively low doping concentration or of undoped is preferably provided between the active layer 4 and the n-type contact layer 3. With this arrangement, good crystallinity can be obtained in the layers such as the n-type contact layer 3 and/or active layer 4 grown thereon, and in-plane diffusion of the electric current at the time of driving can be facilitated, while improving pressure resistance. The multilayer film preferably includes a superlattice structure in which at least two types of layers alternately layered.

For the active layer 4, in particular, a nitride semiconductor containing In that allows emission in a region from ultraviolet to visible light (red light) with high luminous efficiency is preferably used. For example, when the well layers 4w are made of $In_XGa_{1-X}N$, the content of In (X in the formula) is designed to obtain a desired emission color. The barrier layers 4b and the final barrier layer 4fb can be made of GaN, InGaN, AlGaN, or the like, for example.

The well layers 4w, the barrier layers 4b, and the final barrier layer 4fb may contain an n-type dopant such as Si and/or a p-type dopant such as Mg, but are preferably undoped.

The p-side semiconductor layer 20 includes the second p-side semiconductor layer 6 and a p-type contact layer 7 on which an electrode to be disposed. For example, the second p-side semiconductor layer 6 can be made of AlGaN that contains Mg as a dopant, and the p-type contact layer 7 can be made of GaN that contains Mg as a p-type dopant. The second p-side semiconductor layer 6 preferably has a thickness of 10 nm or greater. Thus, overflow of electric current toward the p-side semiconductor layer 20 can be reduced and internal quantum efficiency of the light emitting element 100 can be improved.

In the p-side semiconductor layer 20, a layer with a dopant concentration lower than either the p-side semiconductor layer 7 or the second p-side semiconductor layer 6 may be provided between the p-side semiconductor layer 7 and the second p-side semiconductor layer 6. For example, in the p-side semiconductor layer 20, an undoped GaN layer with a thickness of about 100 nm can be disposed on the second p-side semiconductor layer 6. This allows to form a light emitting element with high electrostatic withstand voltage, and to improve the crystallinity

EXAMPLE

A light emitting element of Example was formed as below.

Substrate 1

For the substrate 1, a sapphire (C-plane) substrate was employed, and cleaning of the surface of the substrate was performed in a MOCVD reaction vessel in a hydrogen atmosphere at 1050° C.

Buffer Layer

At a temperature of 550° C., using raw material gases of TMA, TMG, and ammonia, a buffer layer of AlGaN was grown on the substrate to a thickness of about 12 nm.

First Underlayer

At a temperature of 1050° C., using raw material gases of TMG and ammonia, a first underlayer 1 of GaN was grown on the substrate to a thickness of about 1 µm.

Second Underlayer

Then, at a temperature of 1,150° C., using raw material gases of TMG and ammonia, a second underlayer 2 of GaN was grown on the substrate to a thickness of about 1 µm.

N-Type Contact Layer 3

Next, at 1,150° C., using TMG, ammonia, and monosilane, an n-type contact layer 3 of n-type GaN doped with Si at a concentration of $1 \times 10_{19}/cm^3$ was grown on the substrate to a thickness of about 6 µm.

Superlattice Layer

Next, at a temperature of 860° C., using raw material gases of TEG, TMI, and ammonia, 20 pairs of a layer of GaN with a thickness of 2 nm and a layer of $In_{0.07}Ga_{0.93}N$ with a thickness of about 1 nm were alternately grown on one another.

Active Layer 4

Next, at a temperature of 840° C., using raw material gases of TEG, TMI, and ammonia, 9 pairs of a barrier layer 4b of GaN with a thickness of about 4.5 nm and a well layer 4w of $In_{0.15}Ga_{0.85}N$ with a thickness of about 3.5 nm were alternately grown on one another, and then a final barrier layer 4fb of GaN with a thickness of about 4.5 nm was grown on the top, thus an active layer 4 was formed.

First P-Side Semiconductor Layer 5

Next, at a temperature of 840° C., using raw material gases of TEG, TMI, and ammonia, the first p-side semiconductor layer 5 of $In_{0.05}Ga_{0.95}N$ with a thickness of about 2 nm was grown on the final barrier layer 4fb.

Second P-Side Semiconductor Layer 6

Next, at 840° C., using TEG, TMA, ammonia, and bis(cyclopentadienyl) magnesium ($Cp_2Mg$), the second p-side semiconductor layer 6 of $Al_{0.17}Ga_{0.83}N$ doped with Mg at a concentration of $1 \times 10^{20}/cm^3$ was grown to a thickness of about 10 nm.

P-Type Contact Layer 7

Then, on the second p-side semiconductor layer 6, undoped GaN was grown to a thickness of about 100 nm, and on the undoped GaN layer, using TMG, ammonia, and $Cp_2Mg$, a p-type contact layer 7 doped with Mg at a concentration of $1 \times 10^{20}/cm^3$ was grown to a thickness of about 23 nm.

After growth, in a nitrogen atmosphere, the wafer thus obtained was placed in a reaction vessel and an annealing was carried out at 700° C. to reduce the resistance of the second p-side semiconductor layer 6 and the p-type contact layer 7.

After annealing, the p-type contact layer 7, the second p-side semiconductor layer 6, the first p-side semiconductor layer 5, and the active layer 4 of certain region were removed to expose a surface for disposing an n-electrode 8 (electrode forming surface).

Then, a p-electrode 9 and an n-electrode 8 were disposed on a portion of the surface of the p-type contact layer 7 and the electrode forming surface, respectively.

The light emitting element according to the present embodiment thus obtained exhibited a driving voltage of about 3.39 V to generate a forward current of 40 mA.

Comparative Example

The light emitting element according to Comparative Example is a light emitting element is similar to that in Example, except that the first p-side semiconductor layer 5 is absent. Thus, detailed description of those similar to the light emitting element according to Example will be appropriately omitted.

The light emitting element according to Comparative Example exhibited a driving voltage of about 3.43 V to generate a forward current of 40 mA.

The light emitting element according to Example was confirmed to achieve a 0.04 V reduction in the driving voltage, that is, about 1.2% lower driving voltage with respect to the light emitting element according to Comparative Example.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:
1. A light emitting element comprising:
an n-side semiconductor layer;
a p-side semiconductor layer;
an active layer comprising a plurality of well layers and a plurality of barrier layers, and being located between the n-side semiconductor layer and the p-side semiconductor layer;
wherein the plurality of barrier layers comprises a final barrier layer, which is a layer of the active layer that is closest to the p-side semiconductor layer;
wherein the p-side semiconductor layer comprises, from an active layer-side, a first p-side semiconductor layer, which is a layer of the p-side semiconductor layer that is closest to the active layer, and a second p-side semiconductor layer containing a p-type dopant and having a bandgap greater than a bandgap of the final barrier layer; and
wherein the first p-side semiconductor layer has a bandgap smaller than the bandgap of the final barrier layer and greater than a bandgap of any of the well layers, and has a thickness smaller than a thickness of the final barrier layer.

2. The light emitting element according to claim 1, wherein the thickness of the first p-side semiconductor layer is smaller than a thickness of any one of the well layers.

3. The light emitting element according to claim 1, wherein the first p-side semiconductor layer is an undoped layer.

4. The light emitting element according to claim 2, wherein the first p-side semiconductor layer is an undoped layer.

5. The light emitting element according to claim 1, wherein the first p-side semiconductor layer and each of the well layers include In, and an In content of the first p-side semiconductor layer is smaller than an In content of each of the well layers.

6. The light emitting element according to claim 2, wherein the first p-side semiconductor layer and each of the well layers include In, and an In content of the first p-side semiconductor layer is smaller than an In content of each of the well layers.

7. The light emitting element according to claim 3, wherein the first p-side semiconductor layer and each of the well layers include In, and an In content of the first p-side semiconductor layer is smaller than an In content of each of the well layers.

8. The light emitting element according to claim 1, wherein the first p-side semiconductor layer is in contact with the final barrier layer.

9. The light emitting element according to claim 2, wherein the first p-side semiconductor layer is in contact with the final barrier layer.

10. The light emitting element according to claim 5, wherein the first p-side semiconductor layer is in contact with the final barrier layer.

11. The light emitting element according to claim 1, wherein the final barrier layer is made of GaN or AlGaN.

12. The light emitting element according to claim 1, wherein the final barrier layer is an undoped layer.

13. The light emitting element according to claim 11, wherein the final barrier layer is an undoped layer.

14. The light emitting element according to claim 1, wherein the first p-side semiconductor layer is made of InGaN.

15. The light emitting element according to claim 2, wherein the first p-side semiconductor layer is made of InGaN.

16. The semiconductor laser element according to claim 1, wherein the thickness of the first p-side semiconductor layer is in a range of 0.5 nm to 2.5 nm.

17. The semiconductor laser element according to claim 15, wherein the thickness of the first p-side semiconductor layer is in a range of 0.5 nm to 2.5 nm.

18. The semiconductor laser element according to claim 1, wherein the n-side semiconductor layer, the p-side semiconductor layer, the first p-side semiconductor layer, and the active layer are disposed on an upper surface of a sapphire substrate.

19. The semiconductor laser element according to claim 1, wherein the second p-side semiconductor layer is made of AlGaN containing Mg as a p-type dopant.

20. The semiconductor laser element according to claim 2, wherein the second p-side semiconductor layer is made of AlGaN containing Mg as a p-type dopant.

* * * * *